United States Patent
Cheng et al.

(10) Patent No.: US 9,362,362 B2
(45) Date of Patent: Jun. 7, 2016

(54) FINFET WITH DIELECTRIC ISOLATED CHANNEL

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 14/248,455

(22) Filed: Apr. 9, 2014

(65) Prior Publication Data

US 2015/0295046 A1    Oct. 15, 2015

(51) Int. Cl.
| | |
|---|---|
| *H01L 21/84* | (2006.01) |
| *H01L 29/10* | (2006.01) |
| *H01L 29/66* | (2006.01) |
| *H01L 29/06* | (2006.01) |
| *H01L 29/161* | (2006.01) |
| *H01L 21/311* | (2006.01) |

(52) U.S. Cl.
CPC ...... *H01L 29/1083* (2013.01); *H01L 21/31116* (2013.01); *H01L 29/0649* (2013.01); *H01L 29/161* (2013.01); *H01L 29/66795* (2013.01)

(58) Field of Classification Search
CPC .................. H01L 27/1211; H01L 21/845
See application file for complete search history.

(56) References Cited

U.S. PATENT DOCUMENTS

| | | | |
|---|---|---|---|
| 7,528,025 B2* | 5/2009 | Brask | H01L 21/845 438/183 |
| 7,879,660 B2 | 2/2011 | Booth, Jr. et al. | |
| 8,497,171 B1 | 7/2013 | Wu et al. | |
| 2004/0075121 A1* | 4/2004 | Yu | H01L 29/41733 257/288 |
| 2009/0242964 A1* | 10/2009 | Akil | H01L 21/28282 257/324 |
| 2010/0109084 A1 | 5/2010 | Chung | |
| 2011/0079831 A1 | 4/2011 | Oh et al. | |
| 2012/0018785 A1* | 1/2012 | Xu | H01L 29/66795 257/288 |
| 2012/0025316 A1 | 2/2012 | Schultz | |
| 2012/0083107 A1 | 4/2012 | Chang et al. | |
| 2012/0181604 A1 | 7/2012 | Kim et al. | |
| 2013/0049080 A1 | 2/2013 | Okano | |
| 2013/0134506 A1 | 5/2013 | Yagishita | |
| 2013/0210206 A1 | 8/2013 | Cheng et al. | |
| 2014/0273359 A1* | 9/2014 | Kim | H01L 29/66795 438/156 |

* cited by examiner

*Primary Examiner* — Zandra Smith
*Assistant Examiner* — Andre' C Stevenson
(74) *Attorney, Agent, or Firm* — Steven J. Meyers; Joseph J. Petrokaitis; Howard M. Cohn

(57) ABSTRACT

Embodiments of the present invention provide a fin type field effect transistor (FinFET) and methods of fabrication. A punchthrough stopper region is formed on a semiconductor substrate. An insulator layer, such as silicon oxide, is formed on the punchthrough stopper. Fins and gates are formed on the insulator layer. The insulator layer is then removed from under the fins, exposing the punchthrough stopper. An epitaxial semiconductor region is grown from the punchthrough stopper to envelop the fins, while the insulator layer remains under the gate. By growing the fin merge epitaxial region mainly from the punchthrough stopper, which is part of the semiconductor substrate, it provides a higher growth rate then when growing from the fins. The higher growth rate provides better epitaxial quality and dopant distribution.

20 Claims, 5 Drawing Sheets

FINFET WITH DIELECTRIC ISOLATED CHANNEL

FIELD OF THE INVENTION

The present invention relates generally to semiconductor fabrication, and more particularly, to a fin type field effect transistor (FinFET) and methods of fabrication.

BACKGROUND OF THE INVENTION

Field effect transistors (FETs) that are formed on a bulk substrate utilize a punchthrough stopper to isolate the device from the substrate. In contrast, semiconductor-on-insulator (SOI) FETs utilize an insulator layer to provide isolation between the device and the substrate. Both the SOI devices and the devices formed on a bulk substrate have advantages and disadvantages. It is therefore desirable to have improvements in field effect transistors that can combine advantages of both types, and reduce the disadvantages associated with each type.

SUMMARY OF THE INVENTION

In a first aspect, embodiments of the present invention provide a semiconductor structure comprising: a semiconductor substrate; a punchthrough stopper region formed on the semiconductor substrate; an insulator region formed on a portion of the punchthrough stopper region; a gate formed on the insulator region; a fin formed over the punchthrough stopper region, and traversing the gate; and an epitaxial semiconductor region disposed on the fin and in direct physical contact with the punchthrough stopper region.

In a second aspect, embodiments of the present invention provide a semiconductor structure comprising: a semiconductor substrate; a punchthrough stopper region formed on the semiconductor substrate; an insulator region formed on a portion of the punchthrough stopper region; a gate formed on the insulator region; a plurality of fins formed over the punchthrough stopper region, and traversing the gate, wherein each fin of the plurality of fins has a width ranging from about 6 nanometers to about 12 nanometers; and an epitaxial semiconductor region disposed on the plurality of fins and in direct physical contact with the punchthrough stopper region.

In a third aspect, embodiments of the present invention provide a method of forming a semiconductor structure, comprising: forming a punchthrough stopper region on a semiconductor substrate; forming an insulator layer on the punchthrough stopper region; forming a plurality of fins on the insulator layer; forming a gate on the insulator layer, such that the plurality of fins traverse the gate; removing the insulator layer from under the plurality of fins, while preserving a portion of the insulator layer disposed directly underneath the gate; and forming an epitaxial semiconductor region disposed on the plurality of fins and in direct physical contact with the punchthrough stopper region.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
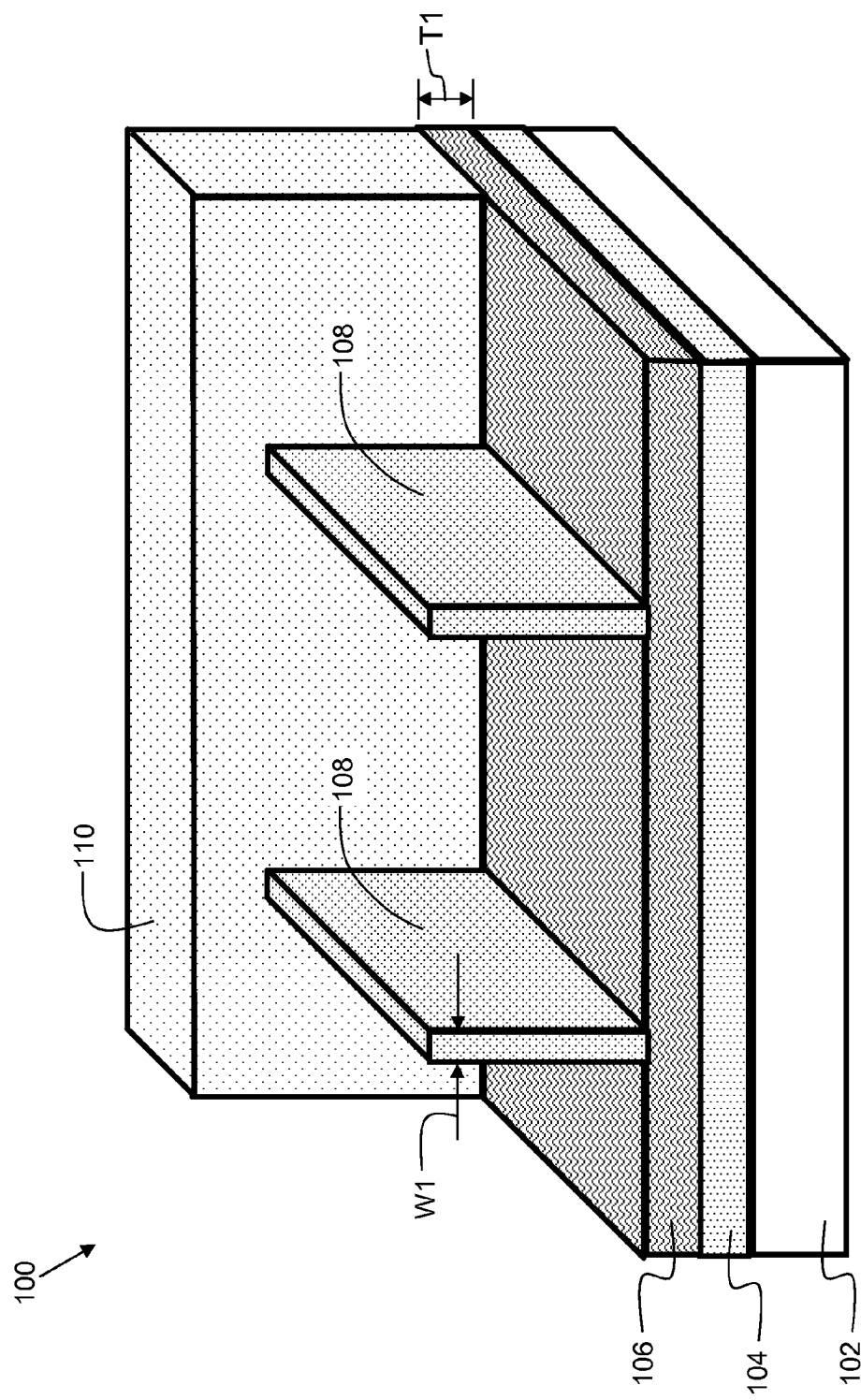

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for embodiments of the present invention.

Figure 2:
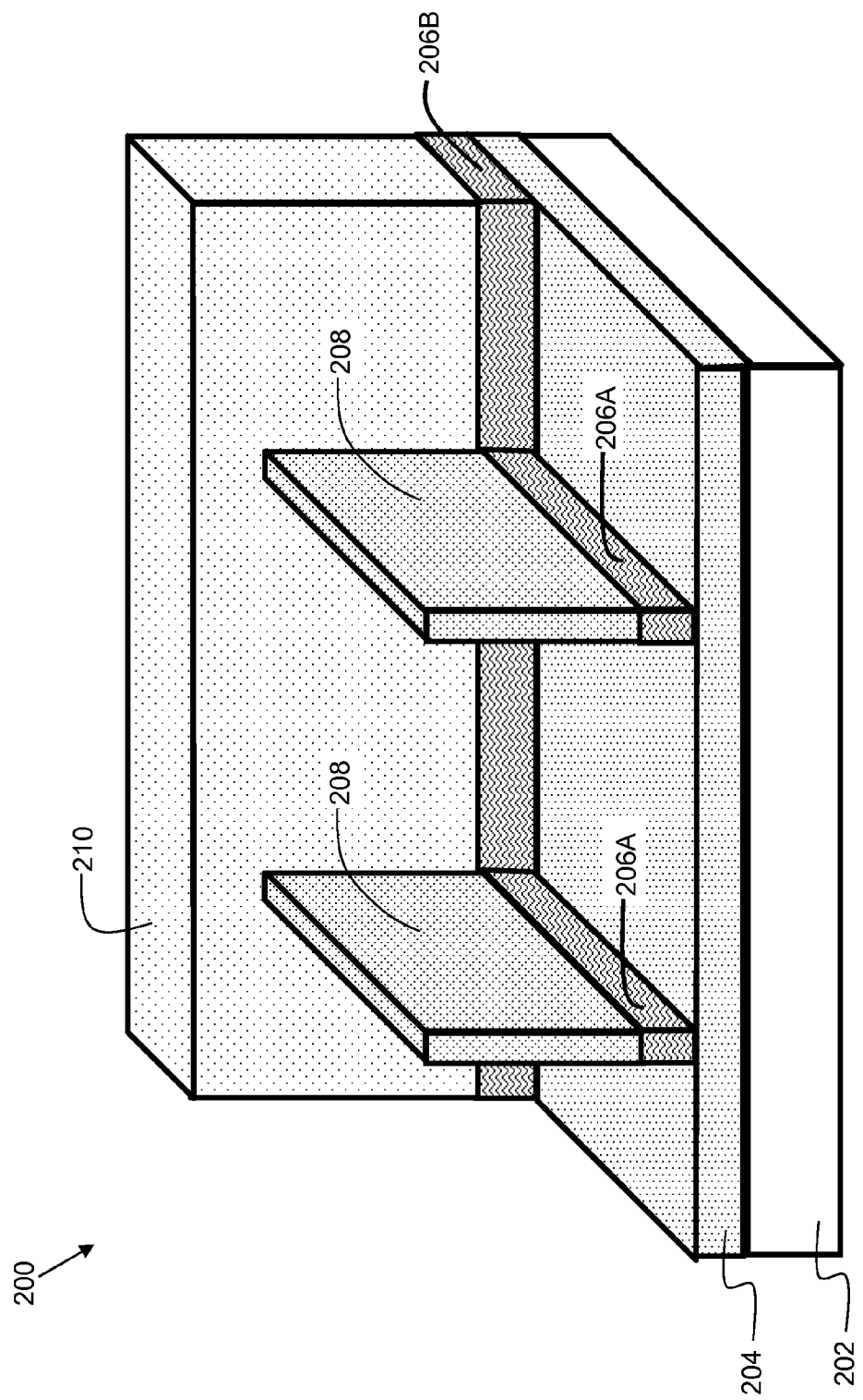

FIG. 2 shows a semiconductor structure after a subsequent process step of performing an anisotropic etch on the insulator region, in accordance with embodiments of the present invention.

Figure 3:
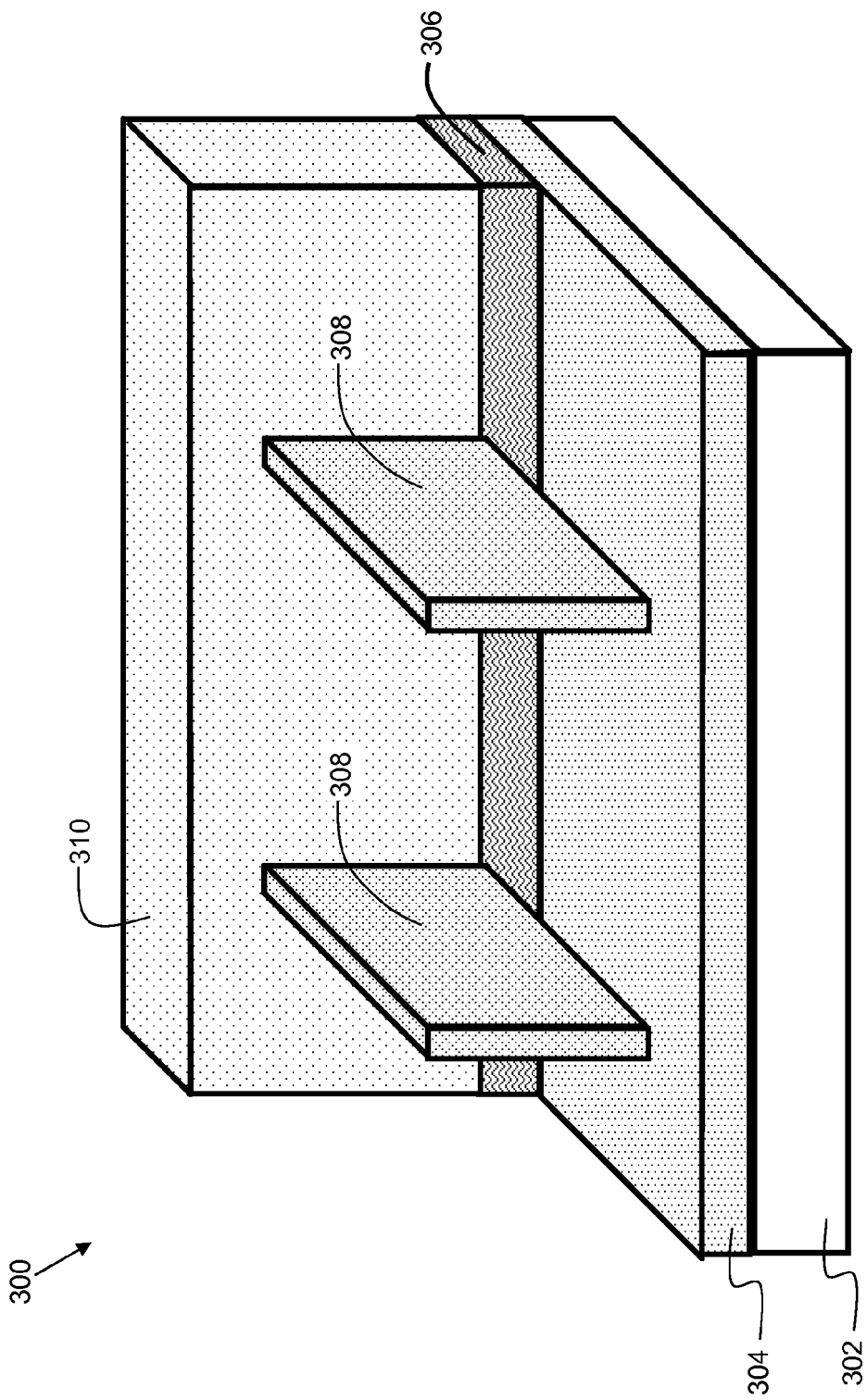

FIG. 3 shows a semiconductor structure after a subsequent process step of performing an isotropic etch on the insulator region, in accordance with embodiments of the present invention.

Figure 4:
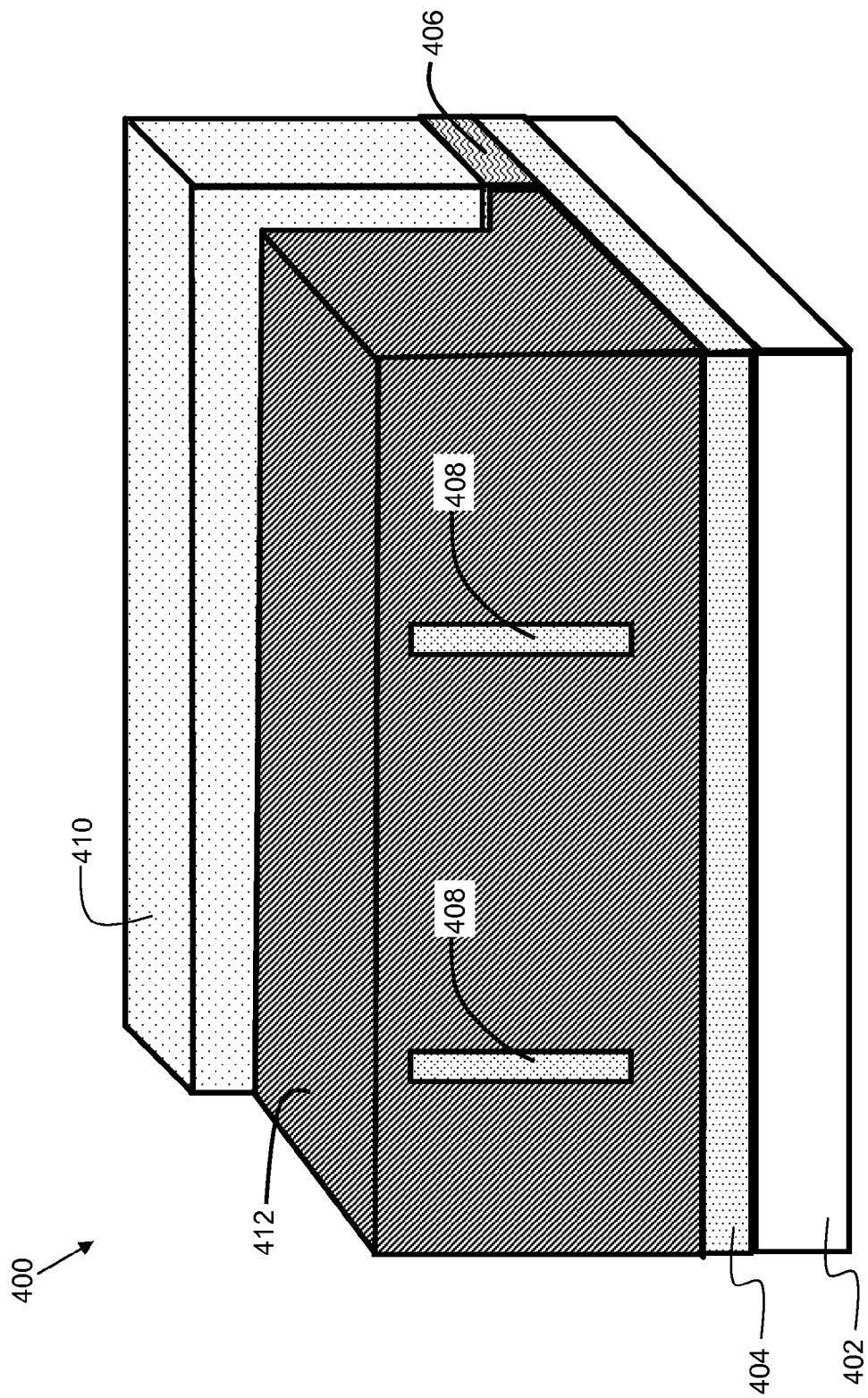

FIG. 4 shows a semiconductor structure after a subsequent process step of forming an epitaxial region, in accordance with embodiments of the present invention.

Figure 5:
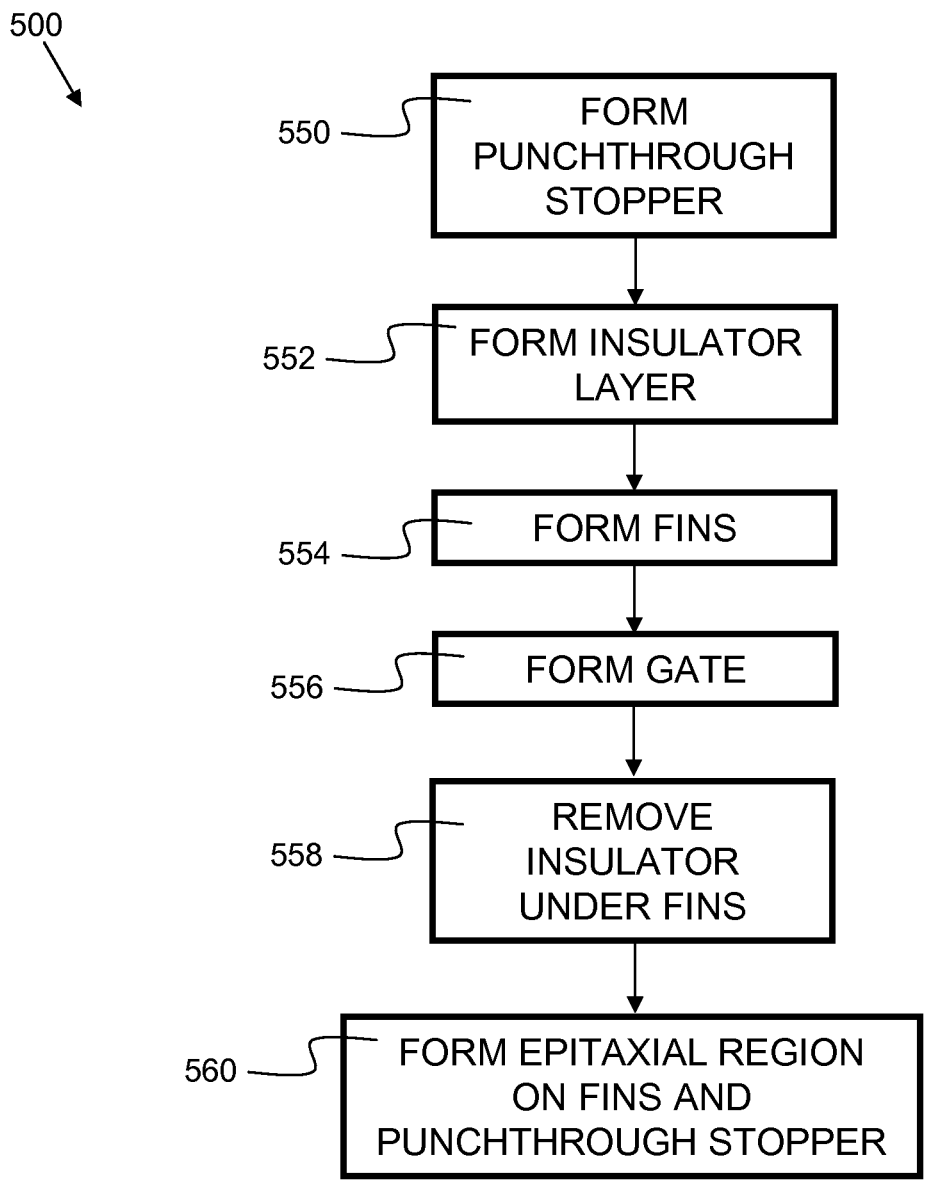

FIG. 5 is a flowchart indicating process steps for an embodiment of the present invention.

DETAILED DESCRIPTION

Embodiments of the present invention provide a fin type field effect transistor (FinFET) and methods of fabrication. A punchthrough stopper region is formed on a semiconductor substrate. An insulator layer, such as silicon oxide, is formed on the punchthrough stopper. Fins and gates are formed on the insulator layer. The insulator layer is then removed from under the fins, exposing the punchthrough stopper. An epitaxial semiconductor region is grown from the punchthrough stopper to envelop the fins, while the insulator layer remains under the gate. By growing the fin merge epitaxial region mainly from the punchthrough stopper, which is part of the semiconductor substrate, it provides a higher growth rate then when growing from the fins. The higher growth rate provides better epitaxial quality and dopant distribution. Additionally, an improved strain benefit is also achieved. Another important advantage is that the epitaxial region envelops the fins in the source/drain region. These advantages result in improved device performance, and reduced variability amongst devices.

FIG. 1 shows a semiconductor structure 100 at a starting point for embodiments of the present invention. A bulk semiconductor substrate 102 forms the base of semiconductor structure 100. Bulk substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. A punchthrough stopper region (PTS) 104 is formed on the semiconductor substrate 102. The PTS 104 is part of the semiconductor substrate that is doped to provide isolation between the substrate 102 and devices formed on the structure 100. The type of dopants used depends on the type of devices formed on the structure. For PFET devices, the dopants in the PTS may include, but are not limited to, arsenic and/or phosphorous. For NFET devices, the dopants in the PTS may include, but are not limited to, boron. The PTS may be formed by ion implantation, or other suitable method. An insulator region 106 is formed on the PTS 104. In embodiments, the insulator region 106 is comprised of silicon oxide. The insulator region 106 has a thickness T1. In embodiments, T1 ranges from about 20 nanometers to about 30 nanometers. Fins 108 are formed on the insulator region 106. In embodiments, the fins 108 are comprised of silicon, silicon germanium, or other suitable semiconductor material. The fins have a width W1. In embodiments, W1 ranges from about 6 nanometers to about 12 nanometers. A gate 110 is formed on the insulator region 106. The gate 110 is oriented perpendicular to the fins 108, such that the fins 108 traverse the gate 110. In embodiments, the gate 110 is comprised of polysilicon. Alternatively, the gate 110 may be a metal gate. The metal gate may be formed using a replacement metal gate (RMG) process. In embodiments, the gate 110 may be comprised of tungsten. In other embodiments, the gate 110 may be comprised of aluminum. One or more work function metal layers (not shown) may be part of the gate 110.

FIG. 2 shows a semiconductor structure 200 after a subsequent process step of performing an anisotropic etch on the insulator region, in accordance with embodiments of the present invention. As stated previously, similar elements may be referred to by similar numbers in various figures (FIGs) of the drawing, in which case typically the last two significant digits may be the same. For example, bulk substrate 202 of FIG. 2 is similar to bulk substrate 102 of FIG. 1. As a result of the anisotropic etch, the insulator region 106 (FIG. 1) is removed from a portion of the PTS 204. A portion of the insulator 206A remains under the fins 208. A portion of the insulator 206B remains under the gate 210.

FIG. 3 shows a semiconductor structure 300 after a subsequent process step of performing an isotropic etch on the insulator region, in accordance with embodiments of the present invention. As a result of the isotropic etch, the portion of insulator under the fins 308 is removed, while the portion of insulator layer disposed directly underneath the gate the gate (306) is preserved. The isotropic etch may be a timed etch, such that the semiconductor structure 300 is exposed to the etchant(s) for a sufficient time to remove the insulator under the fins (refer to 206A of FIG. 2), while not significantly effecting the insulator under the gate (refer to 206B of FIG. 2). The volume of region 206A is much smaller than that of region 206B, and thus, a timed etch can remove the 206A region without significantly effecting the 206B region, resulting in structure 300, where the remaining insulator region is shown as 306. At this point, the fins 308 are mechanically supported by the gate 310, with no substrate directly below the fins outside of the gate 310.

FIG. 4 shows a semiconductor structure 400 after a subsequent process step of forming an epitaxial region 412, in accordance with embodiments of the present invention. The epitaxial region 412 is disposed on the fins 408 and in direct physical contact with the punchthrough stopper region. The epitaxial region envelops the fins. In embodiments, the epitaxial region 412 may comprise silicon. In other embodiments, the epitaxial region 412 may comprise silicon germanium. In embodiments, the silicon germanium material may be of the form $Si(1-x)Ge(x)$, where x may range from about 0.2 to about 0.6. Other ranges are possible and within the scope of the present invention. A silicon germanium material may be used with PFETs to provide beneficial stress that enhances carrier mobility. PTS 404 has a (100) crystalline surface, facilitating faster growth than is possible with a conventional SOI structure, where growth comes from the fins. In terms of forming the epitaxial region used for merging fins, embodiments of the present invention provide the advantages of a bulk device. Yet, the gate 410 is isolated from substrate 402 by insulator layer 406, which provides the reduced leakage performance of a SOI device. Hence, embodiments of the present invention provide advantages of both bulk and SOI devices.

FIG. 5 is a flowchart 500 indicating process steps for an embodiment of the present invention. In process step 550, a punchthrough stopper is formed. The punchthrough stopper may be formed by implanting dopants in the semiconductor substrate. In process step 552 an insulator layer is formed. This step maybe performed by forming an oxide such as silicon oxide. The oxide may be formed using a thermal oxidation process, or deposited using a chemical vapor deposition (CVD) process or other suitable process. In process step 554 fins are formed on the insulator layer. The fins may be formed using a sidewall image transfer (SIT) process or other suitable technique. In process step 556 a gate is formed. The gate may be a polysilicon gate, or alternatively be a metal gate. A replacement metal gate (RMG) technique may be used to form the metal gate. In process step 558, the insulator layer is removed from under the fins. This may be accomplished as a two-step etch process. First, an anisotropic etch is performed, resulting in structure 200 of FIG. 2. Next, an isotropic etch is performed, resulting in structure 300 of FIG. 3. The anisotropic etch may be a selective reactive ion etch (RIE). The isotropic etch may be a wet or dry etch that is selective to oxide. In embodiments, the etch time for the isotropic etch may range between about 10 seconds to about 30 seconds. The etch time is preferably sufficient to remove the regions of insulator under the fins without significantly removing the insulator from under the gate. In process step 560, an epitaxial semiconductor region is formed on the fins and punchthrough stopper. In embodiments, the epitaxial semiconductor region is comprised of silicon. In other embodiments, the epitaxial semiconductor region is comprised of silicon germanium. The epitaxial semiconductor region may also serve to provide beneficial stress/strain to enhance carrier mobility. Note, in embodiments, the order of the steps may deviate from the order shown. For example, step 552 may precede step 550 in some embodiments. Following process step 560, industry standard techniques may be used to complete the fabrication of the integrated circuit (IC).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
   a semiconductor substrate;
   a punchthrough stopper region formed on the semiconductor substrate, wherein the punchthrough stopper (PTS) region comprises a doped region of the semiconductor substrate and comprises a (100) crystalline surface;

an insulator region formed on a portion of the punchthrough stopper region;

a gate formed on the insulator region;

a fin formed over the punchthrough stopper region, and traversing the gate; and an epitaxial semiconductor region disposed on the fin, and in direct physical contact with a bottom surface of the fin, and wherein the epitaxial semiconductor region is also in direct physical contact with the punchthrough stopper region.

2. The semiconductor structure of claim 1, wherein the semiconductor substrate comprises a silicon substrate.

3. The semiconductor structure of claim 2, wherein the punchthrough stopper region comprises arsenic dopants.

4. The semiconductor structure of claim 2, wherein the punchthrough stopper region comprises phosphorous dopants.

5. The semiconductor structure of claim 2, wherein the punchthrough stopper region comprises boron dopants.

6. The semiconductor structure of claim 2, wherein the insulator region comprises silicon oxide.

7. The semiconductor structure of claim 6, wherein the insulator region has a thickness ranging from about 20 nanometers to about 30 nanometers.

8. The semiconductor structure of claim 1, wherein the epitaxial semiconductor region comprises silicon.

9. The semiconductor structure of claim 1, wherein the epitaxial semiconductor region comprises silicon germanium.

10. A semiconductor structure comprising:

a semiconductor substrate;

a punchthrough stopper region formed on the semiconductor substrate, wherein the punchthrough stopper (PTS) region comprises a doped region of the semiconductor substrate and comprises a (100) crystalline surface;

an insulator region formed on a portion of the punchthrough stopper region;

a gate formed on the insulator region;

a plurality of fins formed over the punchthrough stopper region, and traversing the gate, wherein each fin of the plurality of fins has a width ranging from about 6 nanometers to about 12 nanometers; and an epitaxial semiconductor region disposed on the plurality of fins, and in direct physical contact with a bottom surface of each fin, and wherein the epitaxial semiconductor region is also in direct physical contact with the punchthrough stopper region.

11. The semiconductor structure of claim 10, wherein the semiconductor substrate comprises a silicon substrate.

12. The semiconductor structure of claim 11, wherein the punchthrough stopper region comprises arsenic dopants.

13. The semiconductor structure of claim 11, wherein the punchthrough stopper region comprises boron dopants.

14. The semiconductor structure of claim 11, wherein the insulator region comprises silicon oxide.

15. The semiconductor structure of claim 14, wherein the insulator region has a thickness ranging from about 20 nanometers to about 30 nanometers.

16. The semiconductor structure of claim 10, wherein the epitaxial semiconductor region comprises silicon.

17. The semiconductor structure of claim 10, wherein the epitaxial semiconductor region comprises silicon germanium.

18. A method of forming a semiconductor structure, comprising:

forming a punchthrough stopper region having a (100) crystalline surface on a semiconductor substrate by doping a top surface of the semiconductor substrate;

forming an insulator layer on the punchthrough stopper region;

forming a plurality of fins on the insulator layer;

forming a gate on the insulator layer, such that the plurality of fins traverse the gate;

removing the insulator layer from under the plurality of fins, while preserving a portion of the insulator layer disposed directly underneath the gate; and forming an epitaxial semiconductor region disposed on the plurality of fins, and in direct physical contact with a bottom surface of each fin, and in direct physical contact with the punchthrough stopper region.

19. The method of claim 18, wherein removing the insulator layer from under the plurality of fins comprises performing an anisotropic etch of the insulator layer, followed by performing an isotropic etch of the insulator layer.

20. The method of claim 19, wherein performing an anisotropic etch comprises performing a reactive ion etch.

* * * * *